United States Patent
Rossi

(12) 
(10) Patent No.: US 6,909,391 B2
(45) Date of Patent: *Jun. 21, 2005

(54) FULLY DIFFERENTIAL REFERENCE DRIVER FOR PIPELINE ANALOG TO DIGITAL CONVERTER

(75) Inventor: Giuseppe Rossi, Pasadena, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/779,883

(22) Filed: Feb. 18, 2004

(65) Prior Publication Data

US 2004/0160351 A1 Aug. 19, 2004

Related U.S. Application Data

(63) Continuation of application No. 10/226,018, filed on Aug. 23, 2002, now Pat. No. 6,753,801.

(51) Int. Cl.[7] .............................................. H03M 1/38
(52) U.S. Cl. ...................................... 341/161; 341/172
(58) Field of Search ................................ 341/161, 172, 341/144, 143, 155

(56) References Cited

U.S. PATENT DOCUMENTS

| | | | |
|---|---|---|---|
| 5,691,720 A | 11/1997 | Wang et al. | 341/143 |
| 6,008,749 A | 12/1999 | Smith | 341/163 |
| 6,040,793 A | 3/2000 | Ferguson, Jr. et al. | 341/143 |
| 6,157,331 A | 12/2000 | Liu et al. | 341/143 |
| 6,166,367 A | 12/2000 | Cho | 250/208.1 |
| 6,310,567 B1 | 10/2001 | Copley et al. | 341/139 |
| 6,567,028 B2 | 5/2003 | Huang et al. | 341/153 |
| 6,570,519 B1 | 5/2003 | Yang | 341/143 |

*Primary Examiner*—Peguy JeanPierre
(74) *Attorney, Agent, or Firm*—Dickstein Shapiro Morin & Oshinsky LLP

(57) ABSTRACT

An analog to digital conversion (ADC) circuit is disclosed including a fully differential reference voltage source. The reference voltage source includes a programmable current supply adapted to drive a programmed current through a resistor so as to establish an initial reference voltage. The initial reference voltage is sampled onto a capacitive network during a first sampling time interval. The capacitive network is coupled to a differential input of a fully differential amplifier, and maintained at a differential output of the differential amplifier during a second output time interval. An output coupling between the differential output and differential input of the differential amplifier acts to maintain stability of the output voltage during the output time interval.

33 Claims, 13 Drawing Sheets

FULLY DIFFERENTIAL REFERENCE DRIVER FOR PIPELINE ANALOG TO DIGITAL CONVERTER

CROSS REFERENCE TO RELATED APPLICATIONS

The present application is a continuation application of U.S. patent application Ser. No. 10/226,018, filed on Aug. 23, 2002, (now U.S. Pat. No. 6,753,801, issued on Jun. 22, 2004) the disclosure of which is herewith incorporated by reference in its entirety.

FIELD OF THE INVENTION

The present invention relates to an analog to digital converter, and to a reference voltage source for a pipeline analog to digital converter.

BACKGROUND OF THE INVENTION

Modern digital signal processing circuits are of central importance to recent advances in telecommunications, human/computer interface technology, image processing, and many other technologies. Analog to digital converters (ADC's) form an essential link in the signal processing pathway at the interface between the analog and digital domains. Advances in ADC technology have increased the speed, lowered the cost, and reduced the power requirements of analog to digital converters, and resulted in a proliferation of ADC applications.

Among existing ADC technologies are flash ADC, successive approximation ADC, Sigma-Delta ADC, and pipelined ADC. Flash ADC is performed by a highly parallel comparison of an input analog signal to each of a set of reference voltages. Flash ADC can provide very high speed and accuracy at the cost of high component count and high power consumption.

Successive approximation ADC uses one or a few comparators, operated iteratively, to yield high accuracy conversion with far fewer components than flash conversion. Successive approximation ADC, however, operates at much slower conversion rates than flash ADC.

Sigma-Delta converters provide high accuracy conversion by oversampling, but at conversion rates that are also significantly slower than flash conversion.

Pipeline ADC provides analog to digital conversion that, while slower than flash conversion, is faster than most other ADC architectures. Pipeline ADC's introduce a latency (delay) between analog signal input and digital signal output. Conversion throughputs of pipeline ADC's, however, approach those of flash converters. Unlike flash converters, for which component counts increase exponentially with converter resolution, the component counts of pipeline ADC converters increase linearly with resolution. Consequently, pipeline ADC converters are relatively compact, inexpensive, and power efficient. Accordingly, pipeline ADC's are widely used in portable signal processing apparatus.

Pipeline ADC's require stable, low noise, reference voltages for optimum operation. Preferably, these reference voltages are available at low cost in terms of chip real estate and power consumption.

FIG. 1 illustrates an exemplary pipeline ADC in block diagram form. The FIG. 1 circuit is shown as a single ended ADC. In common practice, however, many pipeline ADC's are implemented as fully differential circuits. Nevertheless, single ended representation has been chosen for FIG. 1 so as to reduce the complexity of the diagram, and enhance clarity of the disclosure. The exemplary converter FIG. 1 includes a 10-bit pipeline ADC such as might be integrated on a single substrate with a CMOS Active Pixel Sensor (APS) array.

The pipelined ADC 100 includes a sample-and-hold stage 102 followed by 9 conversion stages 104. Each conversion stage 104 includes a coarse ADC 106 for analog to digital conversion of a stage input signal received at a stage input 108. The coarse ADC 106 produces a 1.5 bit digital output signal at an output 110. A 1.5 bit output includes two output bits adapted to output only three possible states, rather than the four states available on a full 2 bit output. Each conversion stage 104 also includes a coarse digital to analog converter (DAC) 112 adapted to receive the 1.5 bit digital output signal of the coarse ADC 106 and produce a corresponding analog output voltage at an analog output 114. The digital output of the ADC conversion stage is also coupled to a digital correction circuit 118 having a plurality of digital inputs 120 each coupled to a respective one of the 9 conversion stages 104. Each conversion stage 104 further includes a subtracting node 122 with first 124 and second 126 analog inputs, and an analog output 128. Also included in the ADC stage 104 is a high precision gain element (amplifier) 130 with a gain of two.

Operation of the above-described conversion stage 104 is as follows: an analog stage input signal is received at an input 107 of the coarse ADC 106 and at the first (positive) input 124 of the subtracting node 122. The coarse ADC 106 produces a 1.5 bit output representing one of three possible values. This 1.5 bit output is applied to the digital input 113 of the coarse DAC 112 which, responsively, produces an analog output signal with a magnitude equal to one of three possible output signal values. As further discussed below, these three output signal values are $+V_R/4$, 0, and $-V_R/4$ where $V_R$ is a reference voltage of particular magnitude. The output signal of the coarse DAC is applied to the second (negative) input 126 of the subtracting node 122. The subtracting node 122 produces an output equal to an arithmetic difference between the magnitude of the analog inputs at its first and second input terminals. This difference, referred to as a residual, is then applied to an input 131 of the high-precision gain stage 130. The precision gain stage 130 produces an amplified residual output signal at its output 134 having a magnitude equal to two times the magnitude of the residual signal. This amplified residual signal is passed on to the input 108 of the next successive ADC stage 104. Meanwhile, the digital output of the coarse ADC is received by the digital correction circuit 118 and logically combined with the digital outputs of the other 8 conversion stages 104 to produce a 10 bit digital output for the pipeline ADC at the output 140 of the digital correction circuit 118.

FIG. 2 is a schematic diagram showing additional detail of the ADC conversion stage 104 described above with respect to FIG. 1. Note that as in FIG. 1, the FIG. 2 circuit is a simplified (single ended) representation of a circuit more commonly implemented as a fully differential stage. Accordingly, one sees an input terminal 108, a coarse ADC stage 106 including first 202 and second 204 comparators each having a respective first input 206 coupled to the input terminal 108 and a respective second input 208 coupled to a respective source 210, 212 of a respective reference voltage. The first 202 and second 204 comparators have respective first 214 and second 216 outputs coupled to respective first 218 and second 220 inputs of a digital latch circuit 224.

The digital latch circuit 224 includes a control input 226 and a 2 bit wide digital output 228. A coarse DAC 112 includes a multiplexer 240 with a 2-bit wide digital control input 242, first 246, second 248, and third 250 analog inputs and an analog output 252. The digital control input 242 of the DAC is coupled to the digital output 228 of the latch 224. As is well known, the analog output 252 of the multiplexer is switchingly coupled to, and assumes the electrical potential of, one of the analog inputs 246, 248, 250 depending on a signal received at the digital input 242.

The precision gain circuit 130 includes a high-gain differential amplifier 130 with a positive input 260, a negative input 262, and an output 264. The positive input 260 of the amplifier 130 is coupled to a source of constant potential (e.g. ground potential 300). The negative input 262 of the amplifier is coupled to a first plate 270 of a first capacitor 272, and a second plate of a second capacitor 276. The negative input 262 of the amplifier is also switchingly coupled to source of ground potential 300 by means of a switching device 280. The first capacitor 272 has a third plate 282 switchingly alternately coupled to the output 264 of the amplifier 130 and to the input terminal 108 of the ADC converter stage 104. The second capacitor 276 has a fourth plate 284 switchingly alternately coupled to the input terminal 108 of the ADC converter stage 104, and the analog output 252 of the multiplexer 240. The first 272 and second 276 capacitors have equal capacitance. Accordingly, the gain of the gain stage is 2 when the first capacitor 272 is switched into the feedback circuit 290.

Each conversion stage 104 of the pipeline ADC 100 requires respective sources of five electrical potentials: ground 300 (common node voltage in a fully differential system), $+V_R$ applied at input 246, $-V_R$ applied at input 250, $+V_R/4$ 210, and $-V_R/4$ 212.

FIG. 3 shows a conventional reference circuit 400 for generating the delta $-V$ref (=Vref_hi−Vref-lo) differential reference voltage required by a fully differential pipeline ADC. The differential reference voltage delta−Vref corresponds to the $+V_R$ and $-V_R$ reference voltages applied at the inputs 246 and 250 of the multiplexer 240 of the single-ended FIG. 2 circuit. The +Vref/4 and −Vref/4 signals required at the respective second inputs 208 of the FIG. 2 comparators 202,204 are readily derived by a capacitive voltage dividing circuit, as known in the art. The corresponding reference voltages (delta−Vref/4) required by a fully differential pipeline ADC are achieved in the same manner.

The FIG. 3 circuit includes a fixed current source 404 coupled between a source of supply voltage 406 and one end 414 of a resistive ladder 408. The current source 404 is adapted to drive a fixed current through the resistive ladder 408. The resistive ladder includes a plurality of resistors 410 with a respective plurality of tap nodes 412 disposed therebetween. A second end 416 of the resistive ladder 408 is coupled to a source of ground potential 300. A first amplifier circuit 440 having a first (positive) 442 and a second (negative) 444 input and a first output 446 is provided. Also provided is a second amplifier circuit 450 with third (positive) 452 and a fourth (negative) 454 input and a second output 456. Both amplifier circuits 440,450 are single ended.

The output 446 of the first amplifier circuit 440 is directly coupled back to the second negative input 444, yielding a gain of 1 for the first amplifier. The output 456 of the second amplifier circuit 450 is directly coupled back to the fourth negative input 454 yielding a gain of 1 for the second amplifier. The first 442 and third 452 inputs of the respective first 440 and second 450 amplifiers are coupled to respective output terminals 460, 462 of respective first 464 and second 466 switching devices. The first 464 and second 466 switching devices each has three inputs 480, each input 480 being coupled to a respective tap node 412 of the plurality of tap nodes.

When electrical current is driven through the resistive ladder 408 by the current source 404, each tap node 412 assumes a particular electrical potential. When a particular tap node 412 is switchingly coupled to the respective positive input 442,452 of the single ended amplifier 440, 450, the output 446, 456 of the amplifier assumes the voltage of the tap node. By an appropriate choice of tap nodes, a desired delta−Vref can be established between the respective outputs 446,456 of the first and second amplifiers. Because the first and second amplifiers are independent single-ended amplifiers, however, the voltage delta−Vref between the output nodes 446, 456 is subject to common mode noise. Moreover, the current that flows through the current ladder dissipates substantial power. Reference circuit 400 is thus costly in terms of thermal budget and battery resources, particularly in the context of miniature equipment.

Accordingly there is a need for a voltage reference circuit capable of supplying a stable and precise reference voltage delta−Vref to an ADC circuit such as a fully differential pipeline ADC circuit.

BRIEF SUMMARY OF THE INVENTION

The present invention applies a fully differential amplifier operating with negative feedback in the charge domain to source a stable reference voltage to, for example, a pipeline analog to digital converter (ADC). In one aspect, a reference voltage value is established by applying a voltage dropped across a single resistor to differential inputs of the fully differential amplifier through a sample and hold circuit.

In a further aspect of the invention the sample and hold circuit is a crowbar network adapted to transfer electric potential across a pair of matched capacitors in response to the closing of a crowbar switch. In a further aspect of the invention a fully differential amplifier is configured with capacitive feedback connections so as to exhibit unity gain.

In yet another aspect of the invention a control circuit is adapted to couple ancillary capacitors into the feedback circuit so as to controllably vary the gain exhibited by the differential amplifier.

In a still further aspect of the invention the differential output voltage output by the fully differential amplifier is divided with a further switched capacitor network to produce a divided reference voltage. In other aspect of the invention, the reference voltage and divided reference voltage are applied at inputs to an ADC such as a pipeline ADC used in a CMOS active pixel sensor array (APS).

In an additional aspect of the invention, the voltage dropped across the single resistor is established by the action of a programmable current source. The programmable current source is adapted to receive a control input corresponding to a required output current. The control input may be a numerical (digital) value or may be an analog signal, one or the other being implemented according to the requirements of a particular system. The control input may be a value received from an external controller, and may include a value based on a feedback signal taken from an output of the fully differential amplifier.

These and other advantages and features of the invention will be more clearly understood from the following detailed description of the invention which is provided in connection with the accompanying drawings.

DETAILED DESCRIPTION OF THE INVENTION

Figure 1:
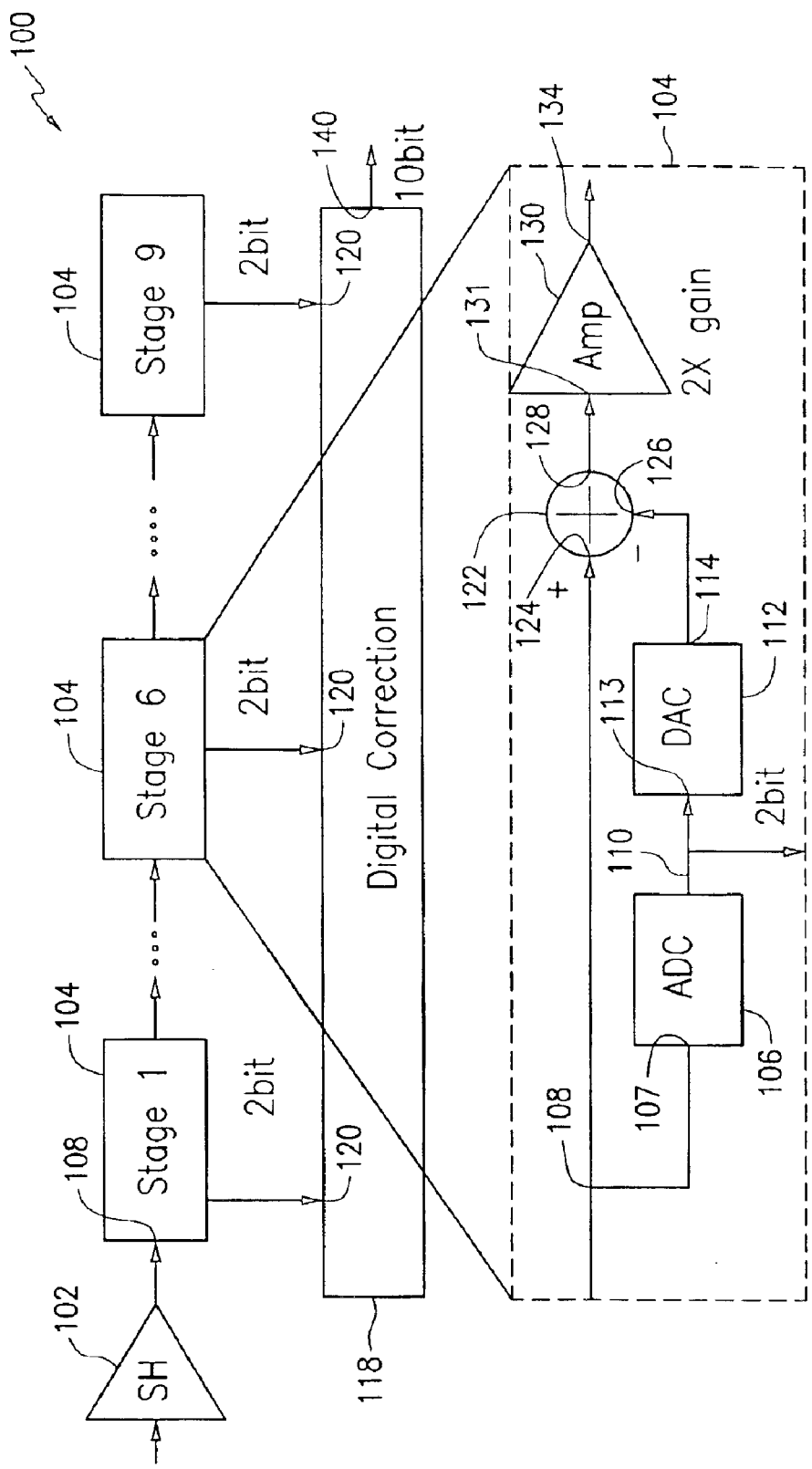
FIG. 1 shows a conventional 10-bit Analog to Digital converter device in block diagram form.
Figure 2:
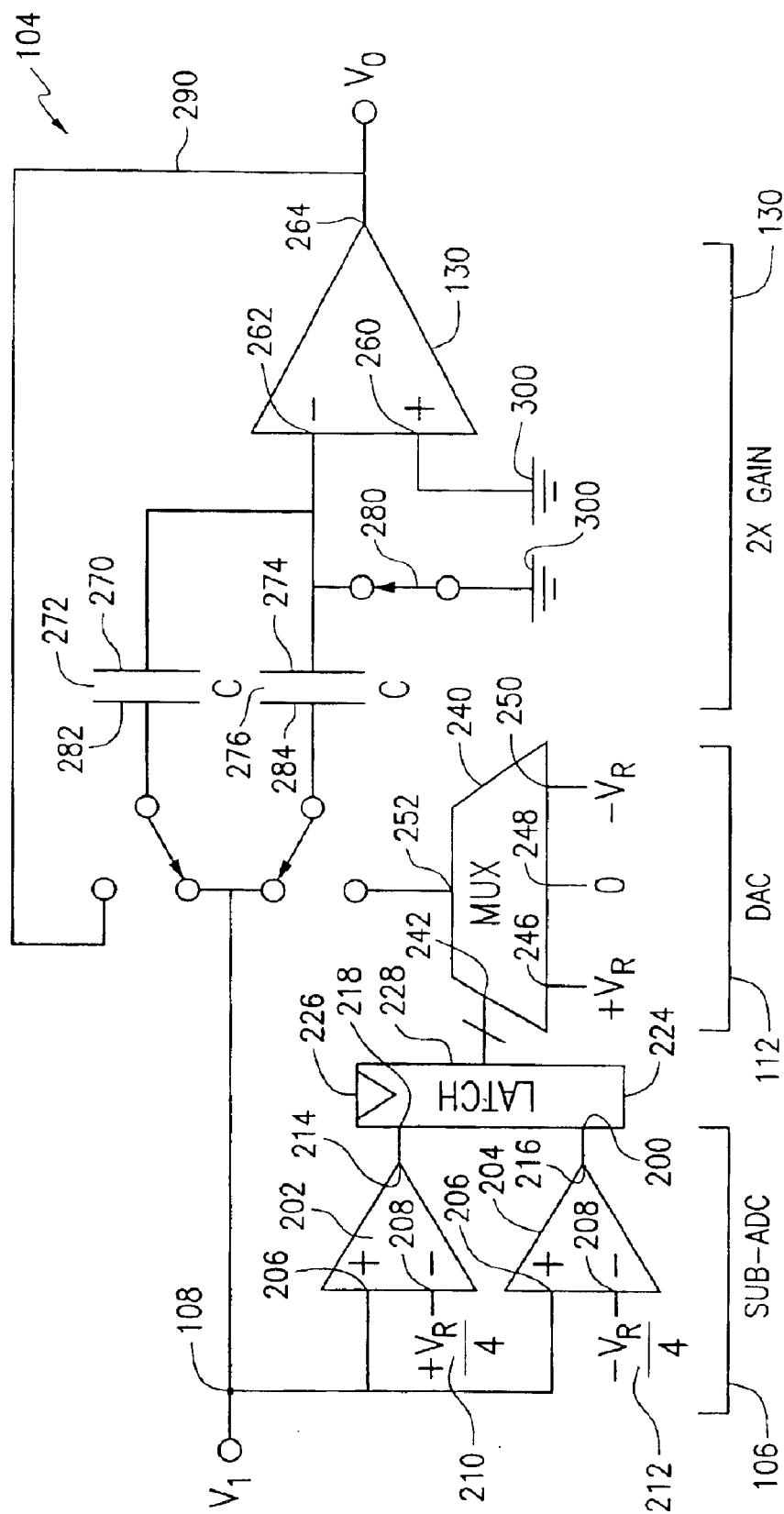
FIG. 2 shows an electrical schematic diagram of a portion the 10-bit pipeline analog to digital converter device of FIG. 1.
Figure 3:
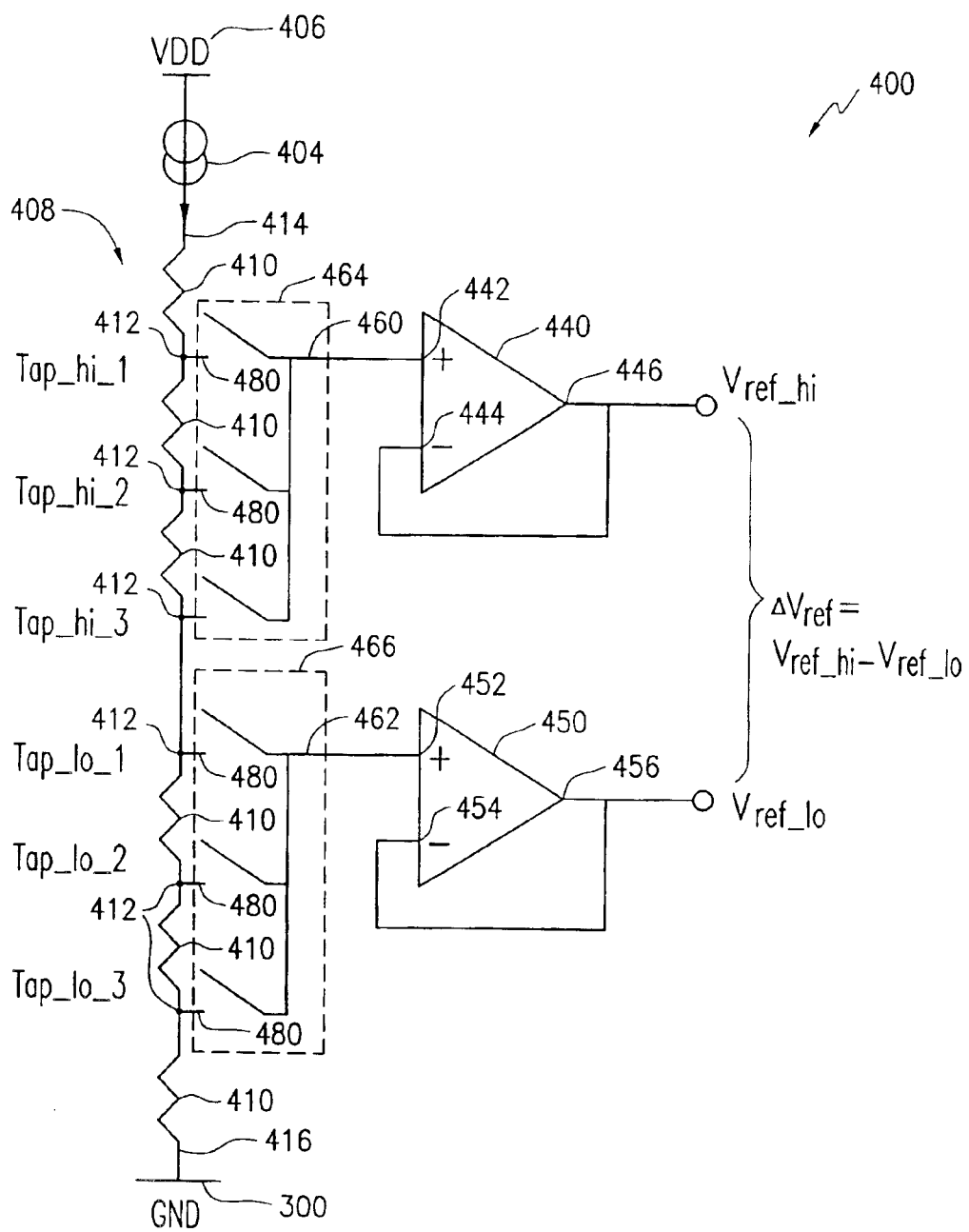
FIG. 3 shows a conventional reference voltage source including two single ended amplifier circuits.
Figure 4A:
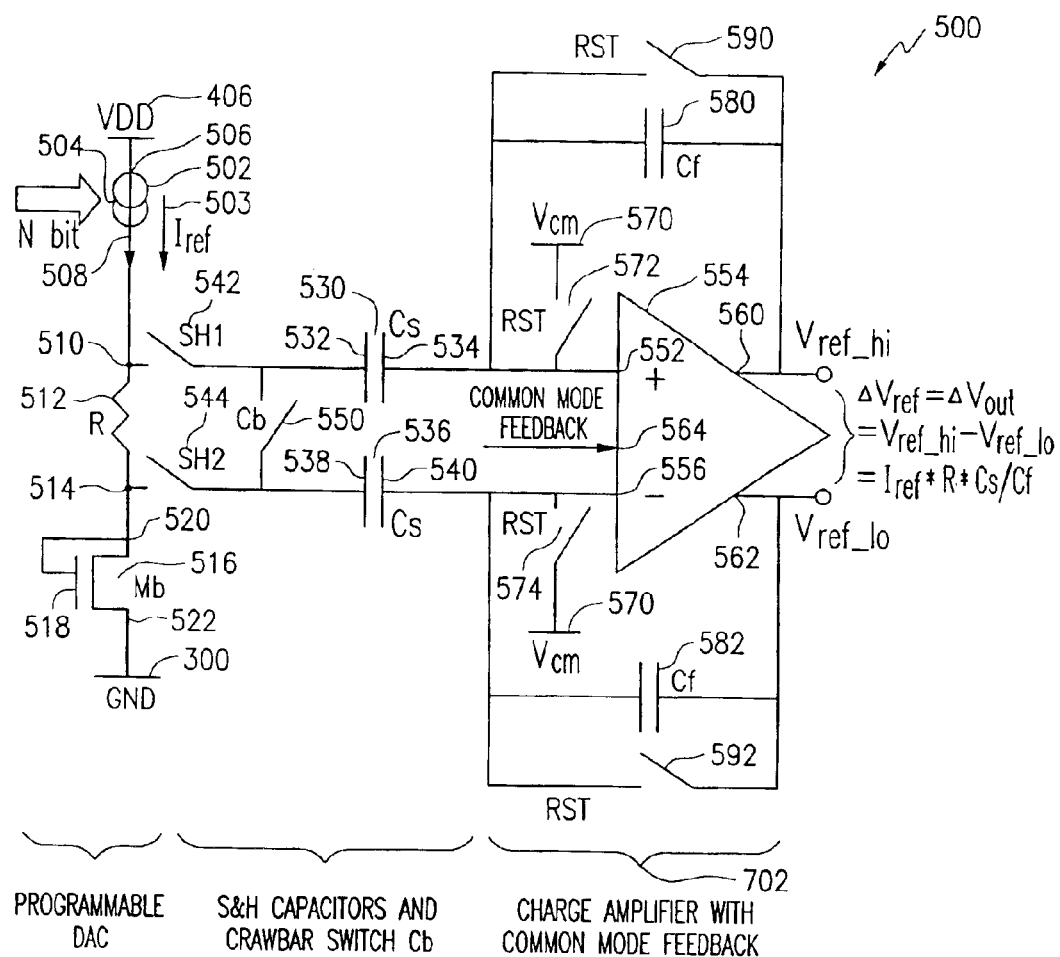
FIGS. 4a–4d shows a reference voltage source including a single differential amplifier circuit in various switching states according to one aspect of the invention.

FIG. 4a shows a fully differential reference circuit 500 for generation and amplification of a differential reference voltage delta–Vref. The differential reference voltage delta–Vref is used by a pipeline ADC according to one aspect of the invention. Note that delta–Vref is equal to Vref high–Vref low at the output of the amplifier. Note also that the absolute value of delta–Vref corresponds to $V_R$ of the single ended circuit of FIG. 2. The circuit of FIG. 4a includes a programmable current source 502 including a digital control input 504 a first power input terminal 506 coupled to a source of supply voltage 406 and a second output terminal 508 coupled to a high tap node 510. A programmable current source having an analog control input 504, or a fixed-output current source, could alternately be employed depending on system requirements. A resistor 512 includes a first end coupled to the high tap node 510 and a second end coupled to a low tap node 514. Also coupled to the low tap node 514 is a transistor 516 configured as an active load with a gate 518 directly coupled to a drain 520 of the transistor 516. A source of the transistor 522 is coupled to a source of ground potential 300. A first sampling capacitor 530 includes a first plate 532 and a second plate 534 and a second sampling capacitor 536 includes a third plate 538 and a fourth plate 540. The first plate 532 of the first capacitor 530 is switchingly coupled through a first switching device 542 to the high tap node 510. The third plate 538 of the second capacitor 536 is switchingly coupled through a second switching device 544 to the low tap node 514. A third switching device 550 directly switchingly couples the first plate 532 and the third plate 538 of the first and second capacitors respectively. The second plate 534 of the first capacitor 530 is coupled to a positive input 552 of a differential amplifier circuit 554. The fourth plate 540 of the second capacitor 536 is coupled to a negative input 556 of the differential amplifier circuit 554.

The differential amplifier circuit 554 includes a first output 560, a second output 562 and a common mode input 564. A source of common mode voltage 570 is switchingly coupled through a fourth switching device 572 to the positive input 552 of the differential amplifier 554. The source of common mode voltage 570 is also switchingly coupled through a fifth switching device 574 to the negative input 556 of the differential amplifier 554. A third capacitor 580 is coupled between the first output 560 and the positive input 552 of the differential amplifier 554. A fourth capacitor 582 is coupled between the second output 562 and the negative input 556 of the differential amplifier 554. A sixth switching device 590 is coupled in parallel with the third capacitor 580 to switchingly shunt the third capacitor 580 and a seventh switching device 592 is coupled in parallel with the fourth capacitor 582 to switchingly shunt the fourth capacitor 582.

In one embodiment of the invention, each of the switching devices 542, 544, 550, 572, 574, 590 and 592 is implemented as an n-type transistor. However, the invention can be fabricated with complementary technology as well.

Figure 4B:
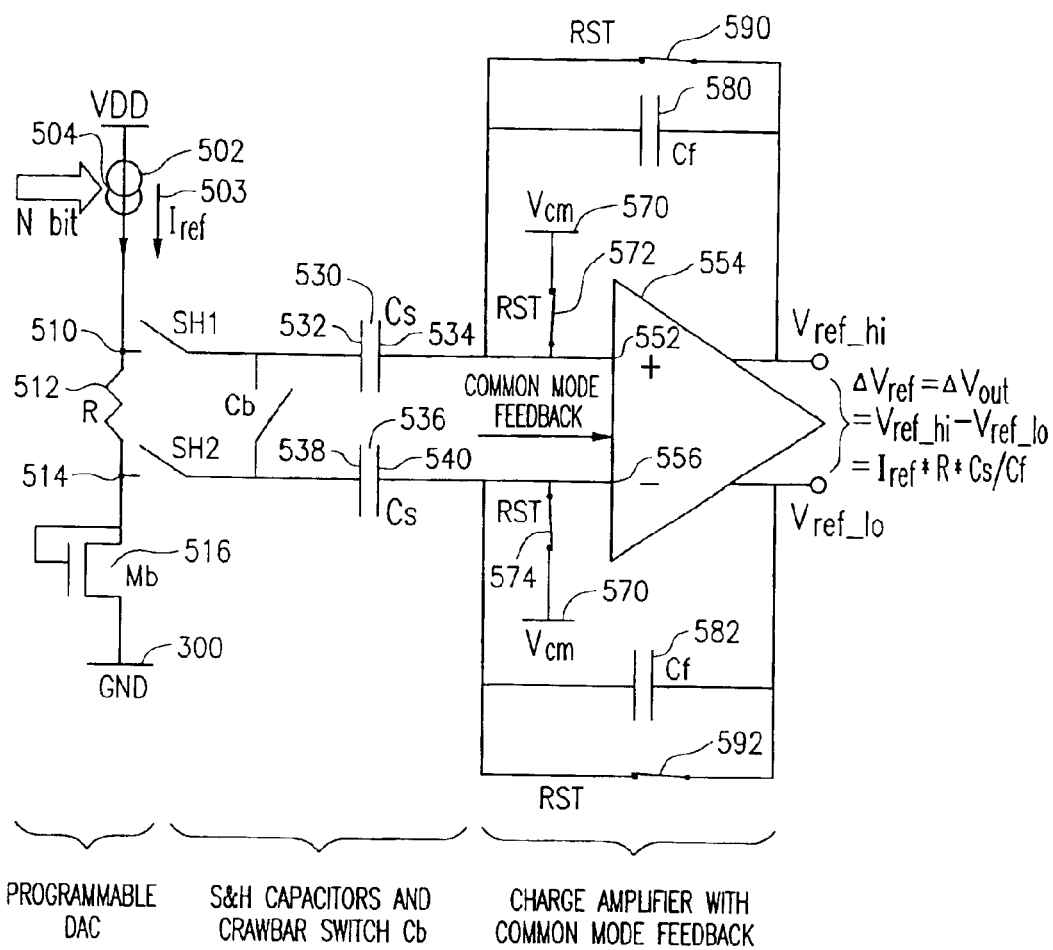
Figure 4C:
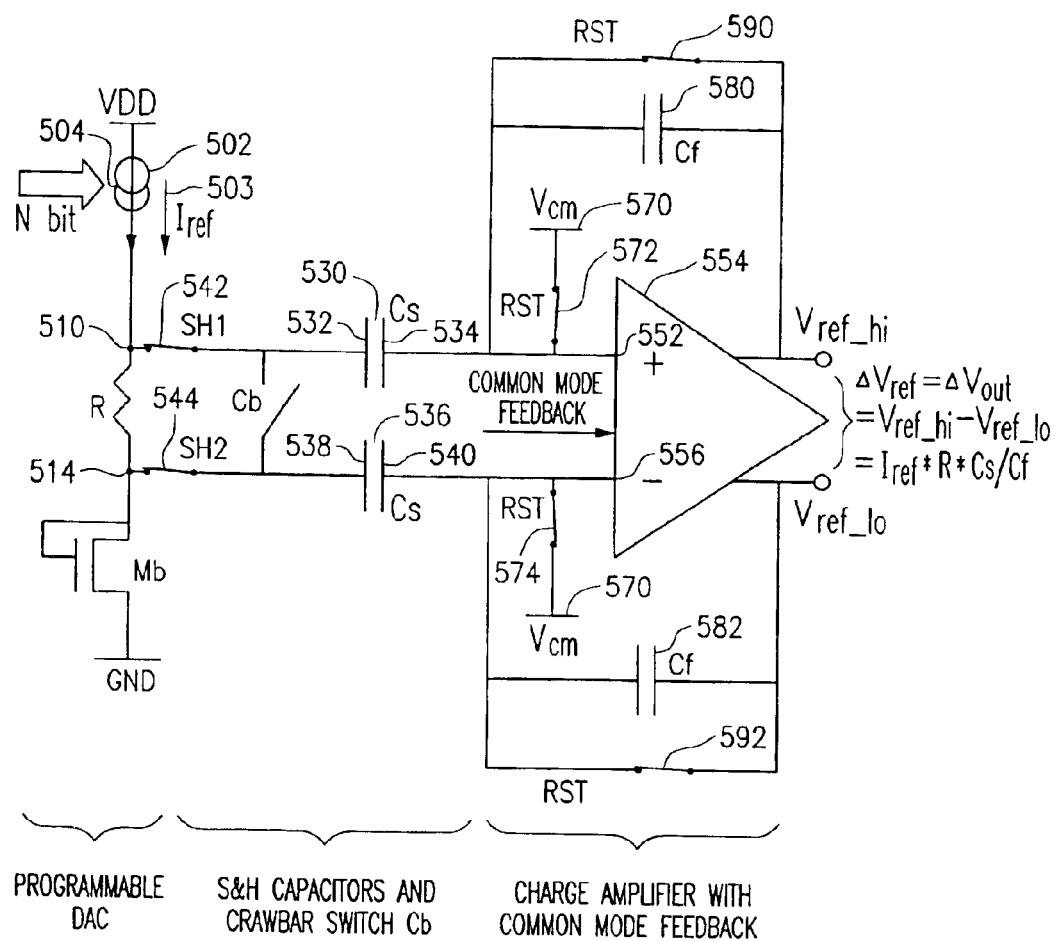
Figure 4D:
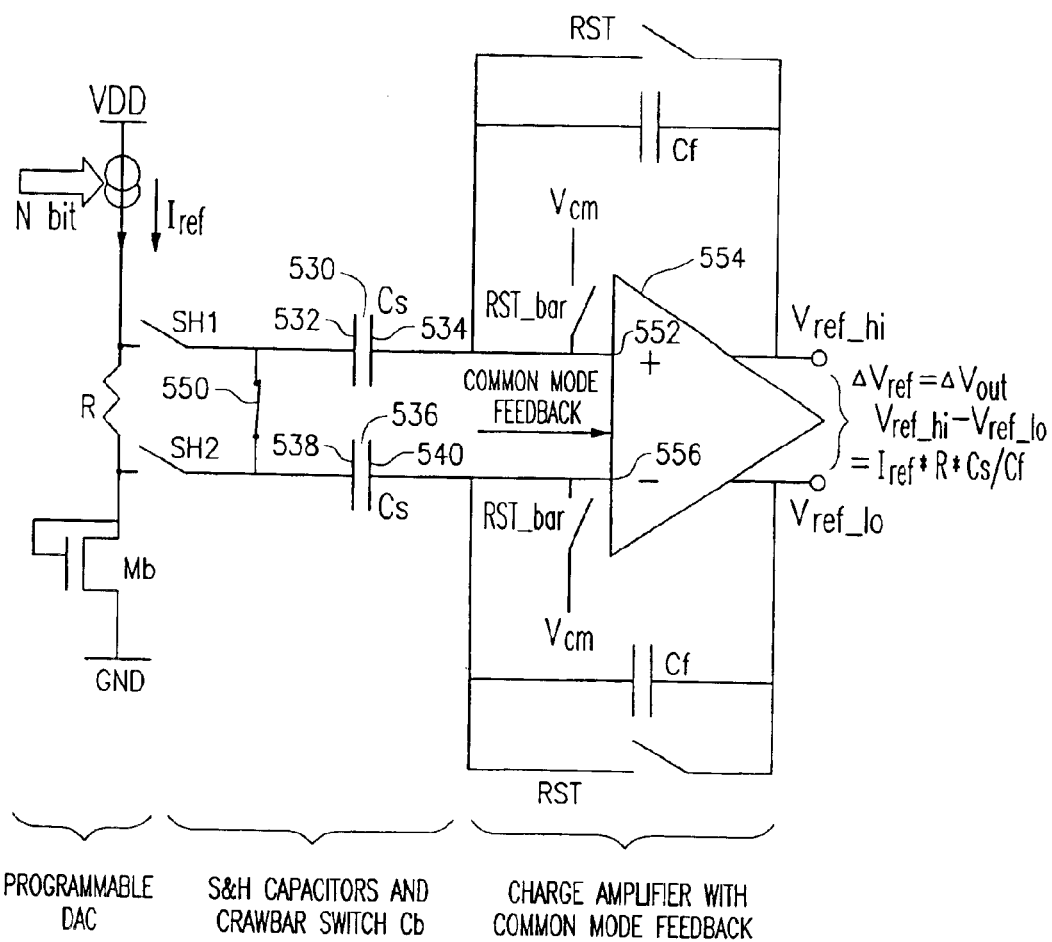
Figure 5:
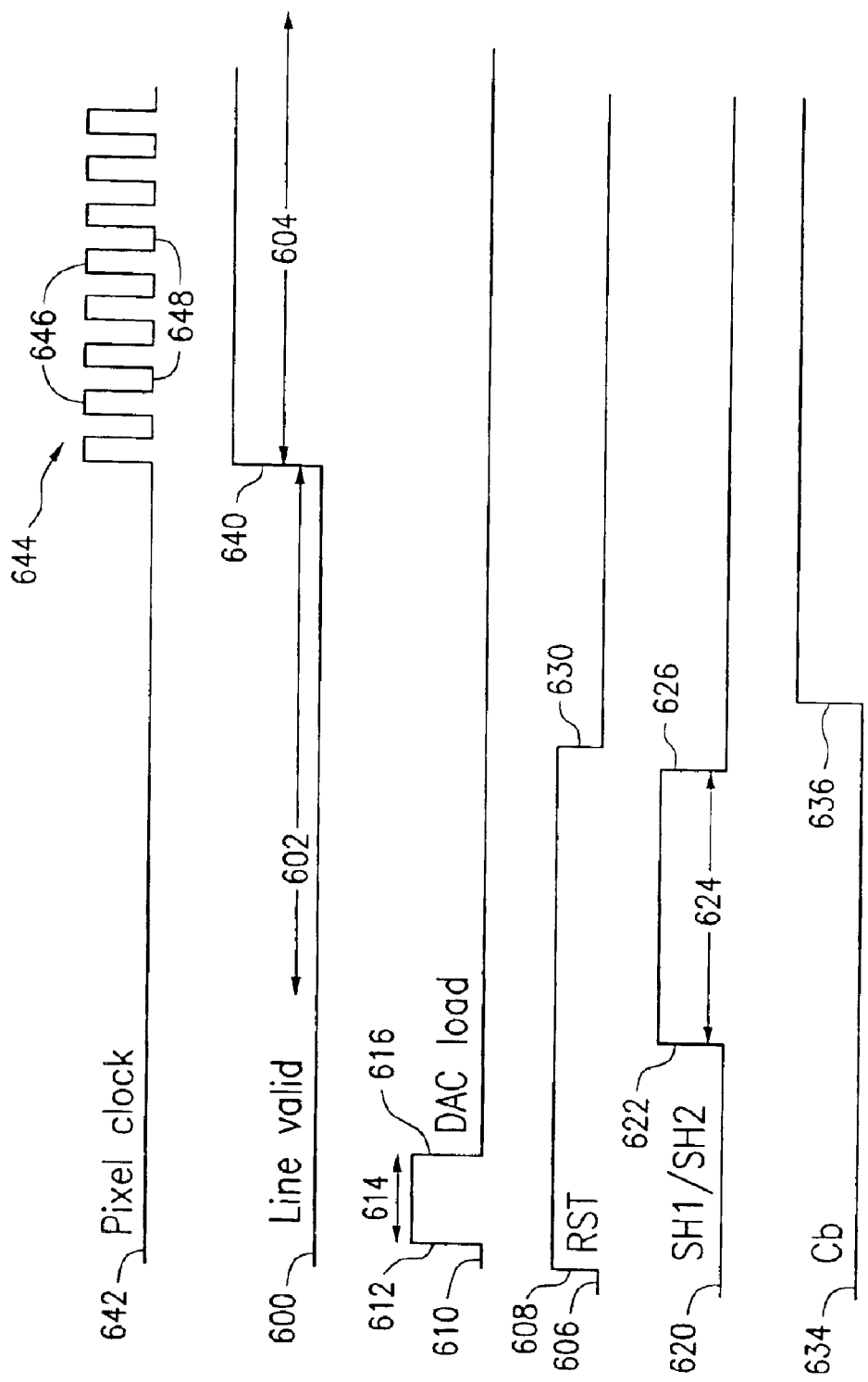
FIG. 5 shows a show the graphical representation with respect to time of electrical signals according to one aspect of the invention.

Operation of the circuit of FIG. 4 is now described with reference to FIGS. 4a–4d and FIG. 5. FIG. 5 shows a timing diagram indicating the operation of the devices of FIG. 4a with respect to time. FIGS. 4b–4d show the various operational configurations of the circuit 500 of FIG. 4a, depending on the state of the FIG. 4a switching devices.

Referring first to FIG. 5, one sees a line valid signal 600 indicating a first calibration time interval 602 during which the line valid signal is low and the circuit of FIG. 4a is establishing its reference voltage output. FIG. 5 also shows a second time interval 604 during which the line valid signal 600 is high and the circuit of FIG. 4a supplies the reference voltage output it produces to, e.g., the pipeline ADC 100 for pixel conversion.

During the line valid low time interval 602, initially, each of the FIG. 4a switching devices 542, 544, 550, 572, 574, 590 and 592 is in a nonconductive state as shown in FIG. 4a. Thereafter, the reset signal 606 transitions from low to high 608. Correspondingly, as shown in FIG. 4b, switching devices 572, 574, 590 and 592 become conductive. Accordingly, the third capacitor 580 and the fourth capacitor 582 are each bypassed by respective switching devices 590 and 592. At the same time, the positive 552 and negative 556 inputs of the amplifier 554 are switchingly coupled to the source of common mode voltage 570, and each assume that voltage. The second 534 and fourth 540 plates of capacitors one 530 and two 536 respectively also assume the common mode voltage 570. This provides a common reference for the high tap and low tap voltages to be applied to the other plates 532, 538 of capacitors one 530 and two 536 respectively.

Next, as seen in FIG. 5, the DAC load signal 610 transitions from low to high 612. Responsively, an N-bit digital value is latched into to the digital input 504 of the programmable current source 502. After a time interval 614, the DAC load signal goes low 616, and the programmable current source 502 outputs a reference current Iref 503 that passes through the resistor 512 and the active load 516 to ground 300. Due to the resistance of the resistor 512 and the effective resistance of the active load 516 the presence of the current Iref 503 establishes a first reference voltage at the high tap node 510 and a second reference voltage at the low tap node 514 according to Ohm's law.

After the DAC load signal goes low 616, the sample and hold signal (SH1/SH2) 620 goes high 622 for a time interval 624. As shown in FIG. 4c, when the sample and hold signal 620 goes high, the two switching devices SH1 542, SH2 544 both become conductive and the reference circuit 500 is configured for sampling. Accordingly, the first 532 and third 538 plates of the first 530 and second 536 capacitors respectively are charged to the respective voltages of the high tap node 510 and the low tap node 514. After the time interval 624 the sample and hold signal 620 goes low 626 and the two switching devices SH1 542, SH2 544 become nonconductive. The circuit 500 is thus, once again, in the state illustrated by FIG. 4b.

The reset signal 606 then goes low 630 and switching devices 572, 574, 590 and 592 become nonconductive. This state of circuit 500 is illustrated by FIG. 4a. This state endures briefly until the crowbar signal 634 goes high 636, and correspondingly, the crowbar switching device 550 becomes conductive. The reference circuit 500 is then configured as shown in FIG. 4d. Responsively, stored charged flows between the first plate 532 of the first capacitor 530 and the third plate 538 of the second capacitor 536 to equalize the voltage on the first 532 and third 538 plates. Consequently, a voltage differential develops between the second 534 and fourth 540 plates of the first 530 and second 536 capacitors respectively. This differential voltage is applied to the positive 552 and negative 556 inputs of the amplifier 554.

The characteristics of the differential amplifier 554 are chosen to match the requirements of a particular ADC circuit. For example, in one embodiment of the invention, the differential amplifier is designed to be capable of driving a capacitive load with a capacitance of from about 1 pF to about 10 pF.

In another embodiment of the invention, the differential amplifier circuit 500 includes a capacitor adapted to receive and maintain a common mode feedback voltage supplied at the common node feedback input 564, during a preliminary initialization phase of operation.

The gain of the amplifier/feedback combination 702 defined in the following equation in which Vo is output voltage, Vi is input voltage, G is gain, Cf is feedback capacitor capacitance, and Cs is Sampling capacitor capacitance:

$$Vo = G * Vi, \text{ where} \qquad (1)$$

G=Cs/Cf

Because the feedback capacitors 590, 592 and the charge storage capacitors 530, 536 all have equal capacitance in the FIG. 4a embodiment, the differential amplifier circuit has a gain of 1. Accordingly, the differential voltage across the second 534 and fourth 540 plates of the first 530 and second 536 capacitors respectively appears across the positive, 560 and negative 562 outputs of the differential amplifier 554. This voltage differential (delta–Vref) is maintained by the feedback paths supplied by the third 580 and fourth 582 capacitors. Thus, after allowing time for the amplifier 554 to stabilize, the line valid signal 600 (FIG. 5) goes high 640, indicating that the reference voltages are available for analog to digital conversion. Thereafter, a pixel clock signal 642 which was low (inactive) during the time interval 602 that the line valid signal 600 was low becomes active, and oscillates 644 between high 646 and low 648 states to clock signals through the ADC pipeline.

Referring again to FIG. 4a, in a further embodiment of the invention, the values of the feedback capacitors 580, 582 are chosen to be different from the values of the sampling capacitors 542 and 544. As a result, the gain produced by the differential amplifier with feedback 702 is not unity, but more generally G, as defined in equation (1) above.

Figure 6:
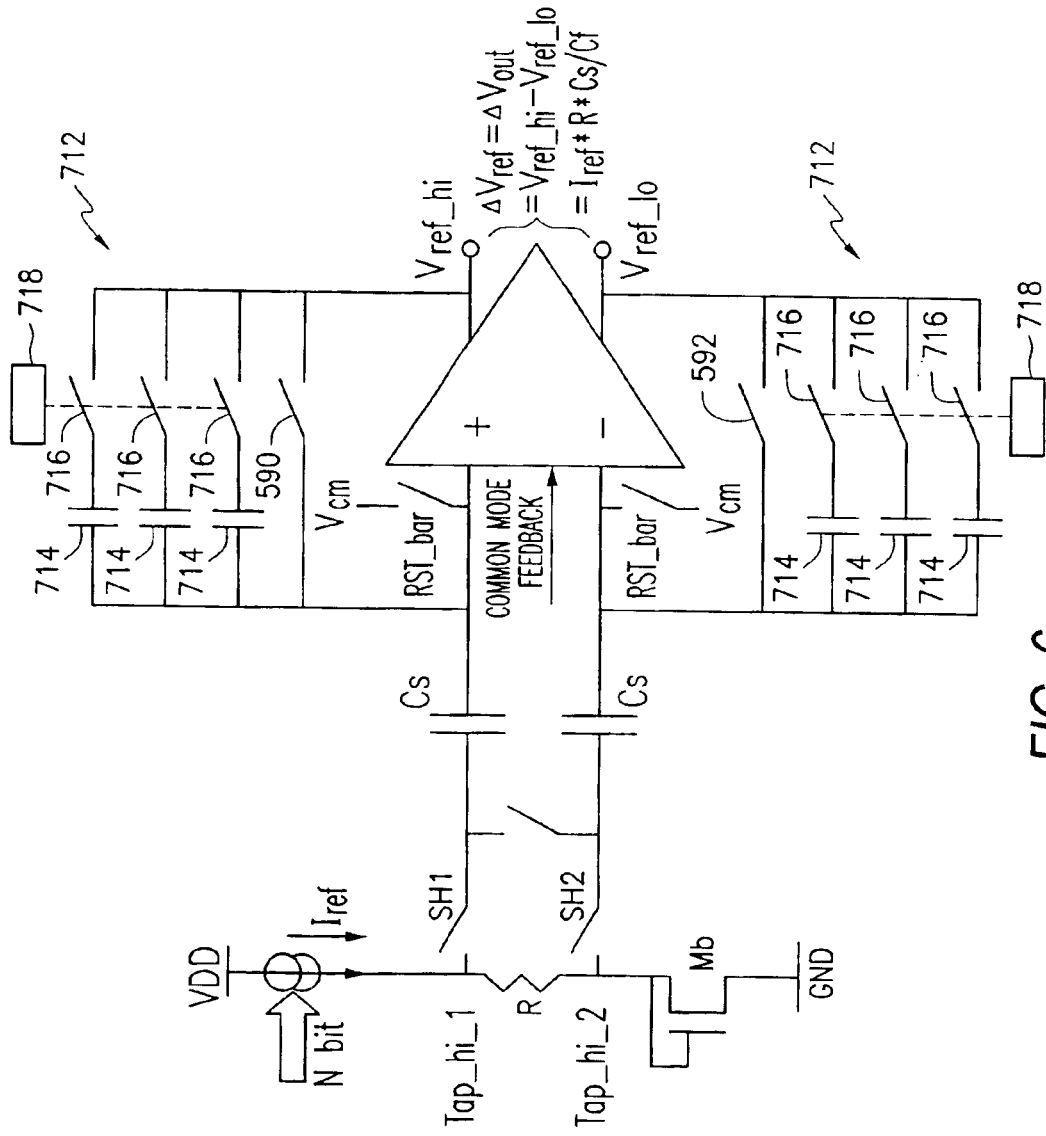
FIG. 6 shows an aspect of one embodiment of the invention in which ancillary feedback capacitors are switchingly coupled in a feedback path.

The respective ratios between the capacitance values of the feedback capacitors, 580, 582 and the sampling capacitors 530, 536 may be fixed, or may be variable. FIG. 6 shows one aspect of the invention in which a circuit providing variable values of feedback capacitance may be implemented by replacing each feedback capacitor 530, 536 with a switchable network 712 including plural feedback capacitors 714 and switching devices 716. In one embodiment of the invention, the number of capacitors 714 connected in parallel in the feedback circuit at any one time is under the control of a control circuit 718. By, for example, doubling feedback capacitor capacitance Cf without changing sampling capacitor capacitance, the gain of the differential amplifier is halved thereby, halving the range of a pipeline ADC coupled to the reference voltage circuit and providing digital gain. By properly controlling the control circuit 718, e.g., with a digital processor, the ADC gain used in reading and exemplary CMOS active pixel sensor array may be adjusted on a frame-by-frame, or even line-by-line, basis.

It should be noted that this halving of delta–Vref could also be achieved by programming the programmable current supply 502 to produce a second reference current 503 half as large as the first reference current. However, halving of reference current implies sacrificing precision in operation of the programmable current supply. Accordingly, in some circumstances, doubling of feedback capacitor capacitance is preferable halving reference current.

Referring again to FIG. 4a, in a further embodiment of the invention, the resistor 512 may be implemented as one of a variety of impedance devices. For example, a variable resistor may be used to provide the resistance of 512. Alternately, a multi-tap resistive ladder including a plurality of fixed resistors connected in series with one another with a respective plurality of tap nodes therebetween can be used to provide a discretely variable resistance. In another embodiment, an active device, such as a field effect transistor may be applied in the FIG. 4a circuit in place of resistor 512. The resistance of the active device may be held fixed, or may be variable under the control of a control input. Where a variable resistance device is used for resistance 512, the ability to vary device resistance provides a further mode for controlling the magnitude of the voltage output by the reference voltage circuit.

Adjustment of the programmable current supply is also used in one embodiment of the invention to compensate for amplifier offset. Without compensation, a fully differential amplifier such as the amplifier 554 of FIG. 4a typically exhibits a non-zero output voltage in response to a zero differential input voltage. This non-zero output voltage is referred to as an "offset" of the amplifier. In a typical amplifier, the value of the offset may range from about 0 millivolts (mV) to about 30 mV. It is known to use an auto-zeroing scheme to charge an internal capacitor of the amplifier 554 to a potential reflecting this offset. This stored potential is then used to compensate for the amplifier offset and produce a zero differential output voltage in response to a zero applied input voltage. Accordingly, in one aspect of the invention, an amplifier including such internal auto-zeroing circuitry is employed in combination with the circuit of FIG. 4a.

Figure 7:
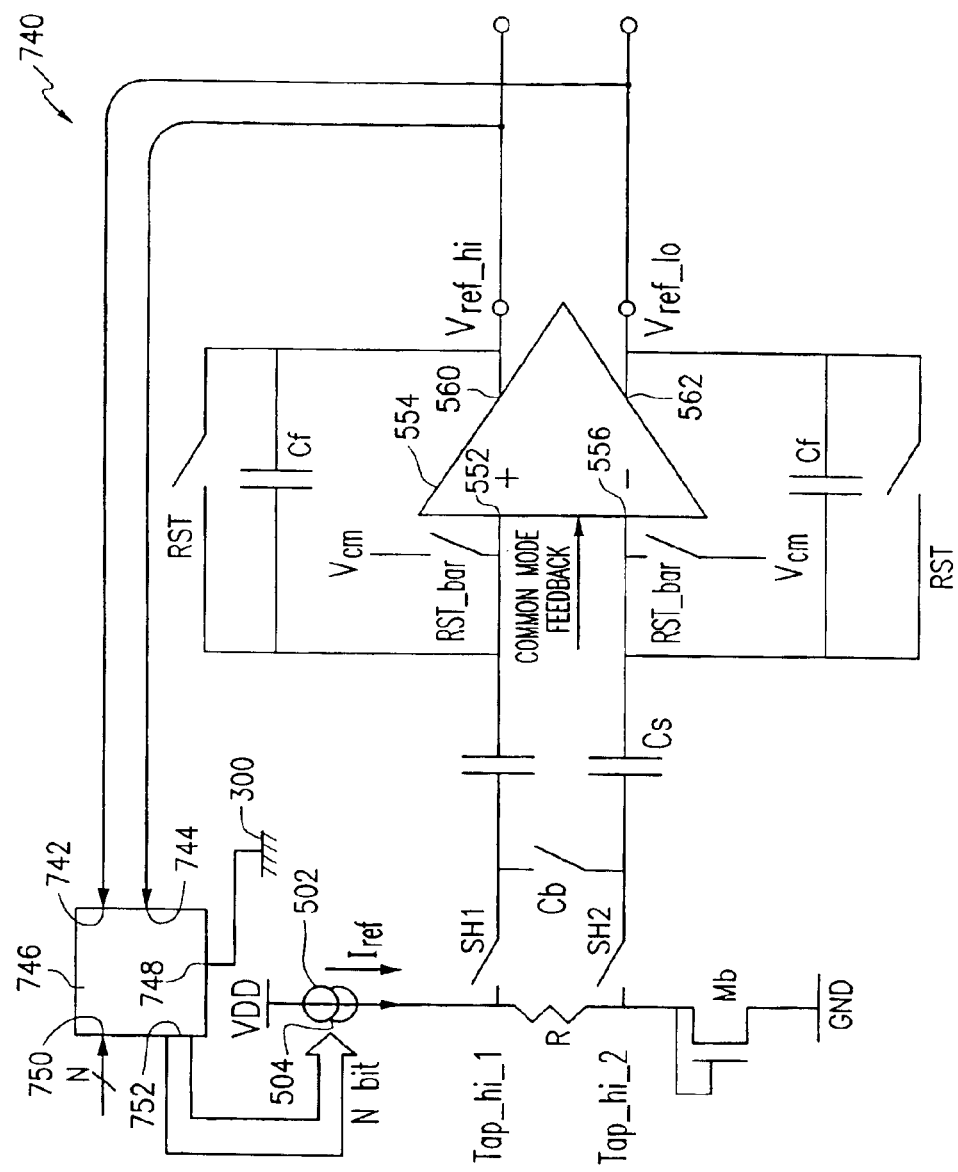
FIG. 7 shows an aspect of one embodiment of the invention in which a feedback connection is coupled between an output of a differential amplifier and a control input of a programmable current source.

FIG. 7 shows a further embodiment of the invention 740 in which an external feedback circuit is employed to compensate for amplifier offset. As illustrated, the differential output terminals 560, 562 of the amplifier 554 of the FIG. 4a circuit are coupled to respective input terminals 742, 744 of a differential input of a feedback control circuit 746. The feedback control circuit 746 includes a reference input 748 coupled to a source of a reference potential such as ground potential 300. A digital control input 750 of the feedback circuit 746 is adapted to receive a raw digital input value, and a digital output port 752 is coupled to the digital control input 504 of the programmable current source 502.

During a calibration phase, a common voltage is mutually connected to both input terminals 552, 556 of the differential input of the amplifier 554 (i.e., a differential voltage of zero is applied). A resulting offset voltage at the output terminals 560, 562 of the differential amplifier 554 is received at the inputs 742, 744 of the feedback circuit 746. The feedback circuit performs an analog to digital conversion of this offset value and the resulting digital value, corresponding to the offset, is summed with a raw digital input (setpoint) received at the digital input port 750 of the feedback circuit 746. The result of this summation is a compensated digital value which is output from the digital output 752 of the feedback circuit 746 and received at the digital input 504 of the programmable current source 502. The result is a digital domain compensation of the amplifier 554 to remove output offset.

In one aspect, the invention includes a manufacturing process adapted to manufacture a reference voltage supply 500 such as that shown in FIG. 4a. The manufacturing process includes the steps of providing and preparing a semiconductor substrate. The substrate is covered with a photomask in a photolithographic process adapted to dispose various components on the semiconductor substrate. Ion implantation and/or vapor deposition and/or thermal diffusion are used to dope various regions of the substrate and to fabricate electrical connections. For example resistor 512 is fabricated in a particular region of the substrate. Transistors are fabricated on the substrate to implement switching devices 542, 544, 550, 572, 574, 590, and 592. A further transistor 516 is implemented with a gate 518 and drain 520 mutually coupled to one end of the resistor 512. Coupled to the other end of the resistor 512 is a programmable current supply 502. The capacitors 530, 536, 580 and 582 are also fabricated on the substrate, as are the components of the differential amplifier 560.

Figure 8:
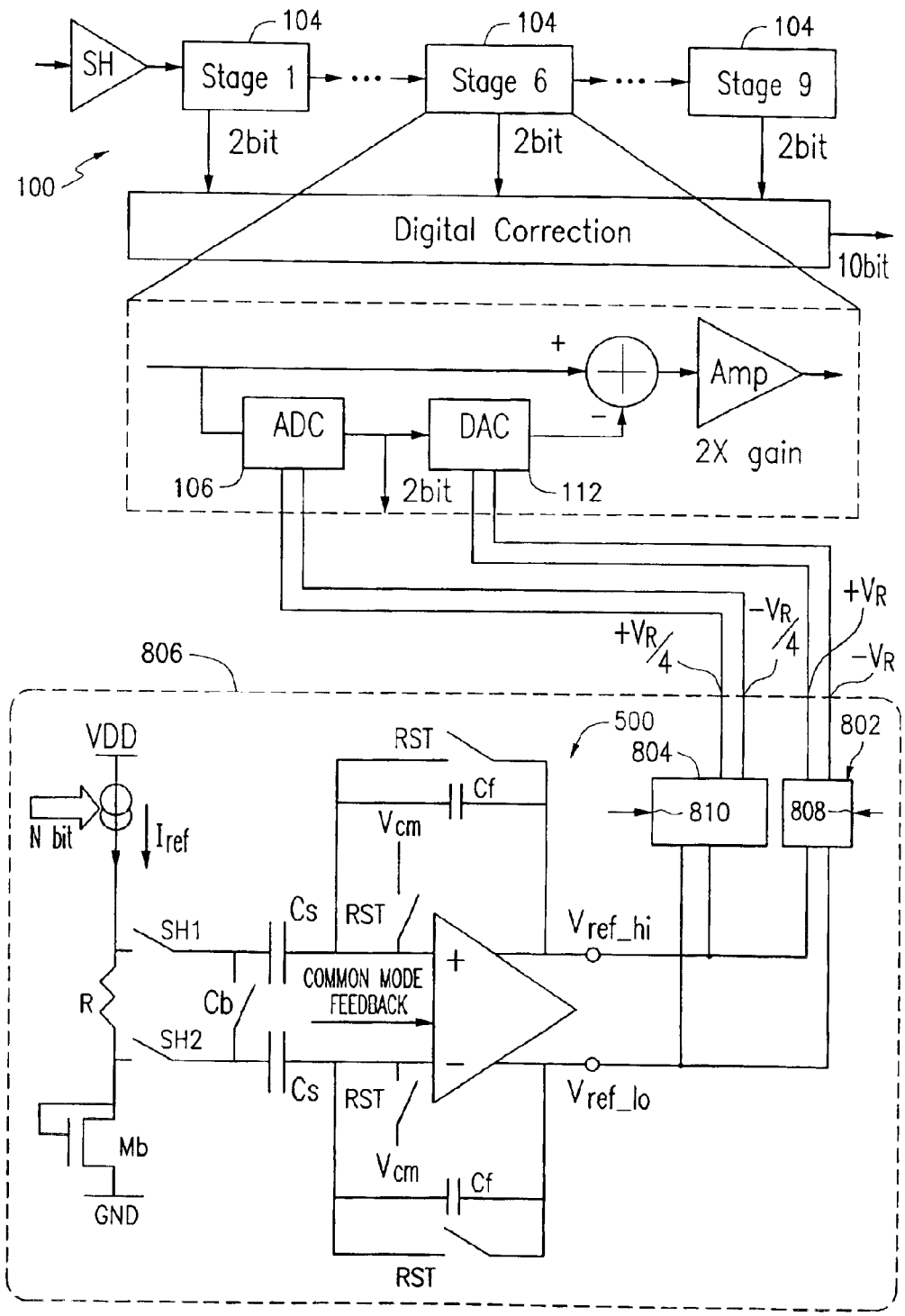
FIG. 8 shows an embodiment of the invention including a reference voltage supply coupled to a pipelined ADC.

FIG. 8 shows an exemplary system in which the reference voltage supply 500 of FIG. 4a is operatively coupled to a switching circuit 802 and a dividing circuit 804 to form a power supply 806 capable of producing $+V_R$, $-V_R$, $+V_R/4$ and $-V_R/4$ voltage outputs (delta-Vref and delta-Vref/4 for a fully differential ADC). As shown, the $+V_R/4$ and $-V_R/4$ voltage outputs are coupled to the ADC portions 106 of each stage 104 of a pipelined ADC 100 and the $+V_R$ and $-V_R$ voltage outputs are coupled to the DAC portions 112 of each stage 104 of the pipelined ADC 100. The switching circuit 802 and the dividing circuit 804 each includes a respective clock input 808, 810. Input 808 receives a first phase of a two-phase non-overlapping clock signal, as is known in the art, and input 810 receives a second phase of the two-phase non-overlapping clock signal. Accordingly, during a first time interval, the voltages $+V_R$ and $-V_R$ are received by the ADC portions 106 of the pipelined ADC converter stages 104, and during a second time interval, the voltages $+V_R/4$ and $-V_R/4$ are received by the DAC portions 112 of the pipelined ADC converter stages 104.

Figure 9:
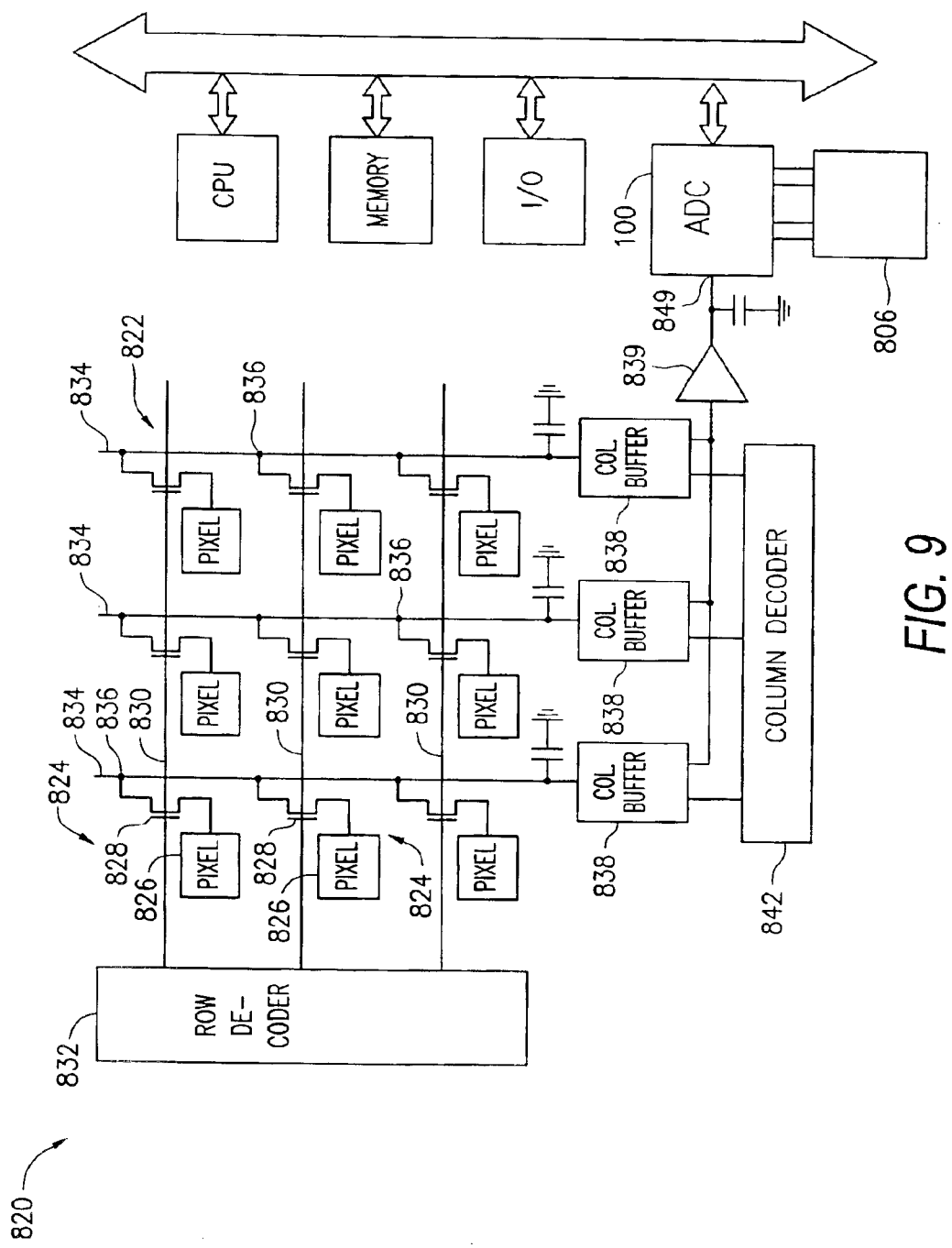
FIG. 9 shows an embodiment of the invention including a reference voltage supply coupled to a pipelined ADC and a CMOS APS array.

FIG. 9 shows a further circuit 820 embodying the invention including an APS array 822 made up of a plurality of active pixel sensors cells 824. Each APS cell includes a photoreceptor 826 and a switching transistor 828. The APS cells are connected by means of a plurality of row lines 830 to a row decoder circuit 832. A plurality of column lines 834 connect the outputs 836 of the APS cells to respective inputs of a respective plurality of buffers 838. Respective outputs of the plurality of buffers are activated under the control of a column decoder 842 and switchingly coupled to an input 844 of an ADC 100 through a variable gain amplifier 839. According to the invention, the ADC 100 receives reference voltages from a reference voltage supply 806 to which it is coupled. In one aspect of the invention, the reference voltage supply is internally configured according to the circuit of FIG. 7 to include voltage switching 802 and voltage dividing 804 circuits.

Figure 10:
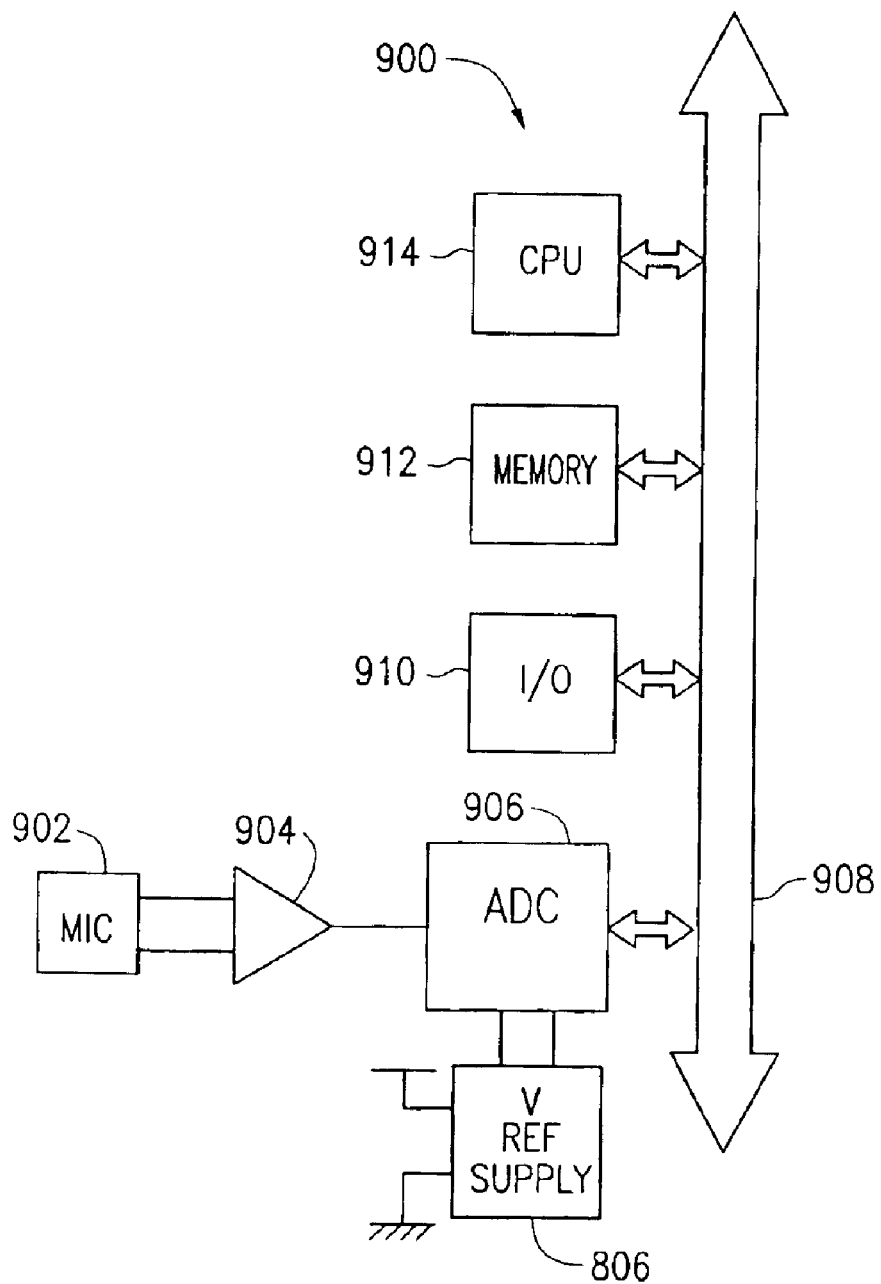
FIG. 10 shows an embodiment of the invention including a reference voltage supply coupled to a pipelined ADC and an audio signal processing system.

FIG. 10 shows another embodiment of the invention including an audio processing system 900. The audio processing system includes a microphone 902, an amplifier 904, and an analog to digital converter 906. The analog to digital converter 906 is coupled to a digital data bus 908. Also coupled to the digital data bus are an I/O device 910, a memory device 912, and a digital processing unit (computer processor) 914. A reference voltage supply 806 is coupled to the ADC according to one aspect of the invention, and the ADC 100 receives reference voltages from the reference voltage supply 806. In operation, the audio processing system 900 receives audio signals at an input to the microphone 902. The audio signals are converted to analog electrical signals by the microphone, and the analog electrical signals are amplified by the amplifier 904. Amplified analog electric signals output from the amplifier 904, are received by the ADC 906. The ADC 906 uses the reference voltages provided by reference voltage supply 806 to convert the analog electrical signals to digital signals. The digital signals are then passed over the digital data bus 908 for processing by the processor 914.

The processing systems illustrated in FIGS. 9 and 10 are only exemplary processing systems with which the invention may be used. It should be recognized that well known modifications can be made to configure the processing system of FIGS. 9 and 10 to become more suitable for use in a variety of applications. For example, many electronic devices which require digital signal processing may be implemented which rely on an ADC coupled to a digital processor. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

While preferred embodiments of the invention have been described in the illustrations above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed as new and desired to be protected by Letters Patent of the United States is:

1. An analog to digital signal conversion system comprising:

an analog to digital converter having a digital signal input line;

a fully differential reference voltage supply coupled to said analog to digital converter by means of a differential signal path, said fully differential reference voltage supply comprising:

a reference resistor adapted to exhibit a reference voltage between first and second nodes thereof in response to a reference current impressed thereupon;

a fully differential amplifier circuit having third and fourth differential signal input nodes, a common mode voltage input node, and fifth and sixth differential signal output nodes, said third and fourth differential signal input nodes coupled to said first and second nodes respectively through respective first and second capacitors, said fifth and sixth differential signal output nodes coupled to said third and fourth differential signal input nodes respectively through respective third and fourth capacitors;

a source of common mode voltage adapted to be switchingly coupled to both said third and fourth differential signal input nodes;

first and second switching devices adapted to switchingly shunt said third and fourth capacitors respectively; and a third switching device adapted to switchingly couple said first and second nodes.

2. An analog to digital signal conversion system as defined in claim 1 further comprising a processing unit coupled to said analog to digital convener through said digital signal input line.

3. An audio processing system, comprising:

an analog audio input device; and analog to digital converter coupled to said analog to digital converter for converting analog signals to digital signals comprising:
 a conversion circuit having an analog signal input, first, second, third, and fourth reference signal inputs, and a digital signal output; and
 a reference voltage circuit having a power supply input, a digital voltage setting input, and first, second, third, and fourth reference signal outputs respectively coupled to said first, second, third, and fourth reference signal inputs, said reference voltage circuit including a reference resistor coupled through a sample and hold circuit to fifth and sixth differential inputs of a fully differential amplifier with seventh and eighth differential outputs alternately switchingly coupled to said first, second, third, and fourth reference signal outputs.

4. An audio processing system as defined in claim 3, further comprising a processor coupled to said analog to digital converter for processing signals received from said analog to digital converter.

5. An audio processing system as defined in claim 3, wherein said analog audio input device is a microphone.

6. A signal processing system, comprising:

an analog audio input device for providing analog audio signals; and an analog to digital converter for converting said analog audio signals to digital output signals, said analog to digital converter comprising:
 a conversion circuit having an analog signal input, first, second, third, and fourth reference signal inputs, and a digital signal output; and
 a reference voltage circuit having a power supply input, a digital voltage setting input, and first, second, third, and fourth reference signal outputs respectively coupled to said first, second, third, and fourth reference signal inputs, said reference voltage circuit including a reference resistor coupled through a sample and hold circuit to fifth and sixth differential inputs of a fully differential amplifier with seventh and eighth differential outputs alternately switchingly coupled to said first, second, third, and fourth reference signal outputs.

7. A signal processing system as defined in claim 6 wherein said fully differential amplifier includes first and second feedback circuits coupled between said sixth differential output and fifth differential input, and eighth differential output and seventh differential input respectively.

8. A signal processing system as defined in claim 6 wherein said sample and hold circuit includes first and second transistors each coupled in series with a respective switching device between a respective end of said resistor and a respective one of said fifth and sixth differential inputs.

9. A signal processing system as defined in claim 7 wherein said first and second feedback circuits each comprises:

a capacitor coupled in parallel with a switching device, said switching device adapted to switchingly shunt said capacitor.

10. A signal processing system as defined in claim 6 further comprising:

respective first and second switching devices respectively switchingly coupled between said first reference signal output and said first reference signal input and between said second reference signal output and said second reference signal input.

11. A signal processing system as defined in claim 6 further comprising:

respective first and second voltage dividing devices respectively switchingly coupled between said third reference signal output and said third reference signal input and between said fourth reference signal output and said fourth reference signal input.

12. A signal processing system as defined in claim 6, further comprising a digital data bus coupled to said analog to digital converter.

13. A signal processing system as defined in claim 6, further comprising a processor coupled to said digital data bus.

14. A signal processing system as defined in claim 6, further comprising a input/output device coupled to said digital data bus.

15. A signal processing system as defined in claim 6, further comprising a memory device coupled to said digital data bus.

16. An analog to digital converter comprising:

an input stage having an input and including a sample and hold circuit;

a plurality of analog to digital stages serially coupled with said input stage and with one another; and a reference voltage circuit adapted to provide a reference voltage to each analog to digital stage of said plurality of analog to digital stages, the reference voltage circuit comprising:

a programmable current supply coupled in series with a resistor and an active load between a source of supply potential and a source of ground potential; and a differential amplifier having a first differential input and a second differential input, said first differential input coupled through a first capacitor and a switching device to a first terminal of said resistor, said second differential input coupled through a second capacitor and a second switching device to a second terminal of said resistor.

17. An analog to digital converter as defined in claim 6, further comprising a feedback circuit between a first output of said differential amplifier and said first differential input.

18. An analog to digital converter as defined in claim 7, wherein said feedback circuit comprises a storage cell between said first output of said differential amplifier and said first differential input.

19. An analog to digital converter as defined in claim 8, wherein said feedback circuit comprises a feedback switch between said first output of said differential amplifier and said first differential input, said feedback switch being coupled in parallel to said storage cell.

20. A switched capacitor voltage source comprising:
   a reference voltage supply including a programmable current source coupled in series with a standard resistor, said reference supply having a first terminal output disposed across said resistor;
   a sampling circuit including a second terminal input coupled to said first terminal output; and
   an amplifier including a third terminal input, a fourth terminal output, and first and second feedback paths coupling said fourth terminal output to said third terminal input, said fourth terminal output adapted to output a first voltage related to a second voltage impressed on said resistor by said programmable current source.

21. A switched capacitor voltage source as defined in claim 20 wherein an output impedance measured at said fourth terminal output is substantially lower than an impedance of said resistor.

22. A switched capacitor voltage source as defined in claim 20 wherein said first and second feedback paths are adapted to produce unity gain between said third terminal input and said fourth terminal output, and wherein said first voltage is related to said second voltage by a factor substantially equal to one.

23. A switched capacitor voltage source as defined in claim 20 wherein said first and second feedback paths each includes a respective capacitor and a respective switching device, said respective switching device being adapted to switchingly shunt said respective capacitor.

24. A reference voltage source circuit for an analog to digital converter comprising:
   a programmable current source having a first control input and a current output;
   a reference impedance device having first and second ends, said first end coupled to said current output;
   a sample and hold circuit having first and second sample and hold inputs coupled to said first and second ends of said reference impedance device respectively, said sample and hold circuit having first and second sample and hold outputs; and
   a amplifier circuit having first and second amplifier inputs respectively coupled to said first and second sample and hold outputs, said amplifier circuit having first and second amplifier outputs, said amplifier circuit including a feedback circuit between said amplifier output and amplifier input, wherein said feedback circuit including a first feedback input coupled to said first amplifier output, said feedback circuit including a second control input and a control output, said control output being coupled to said first control input of said programmable current source.

25. A reference voltage source circuit for an analog to digital converter as defined in claim 24 wherein said first control input comprises a digital control input.

26. A reference voltage source circuit for an analog to digital converter as defined in claim 24 wherein said reference impedance device comprises a variable resistor.

27. A voltage source adapted for use in an analog to digital converter comprising:
   a switched capacitor circuit including a sample and hold portion and an amplifier portion, said sample and hold portion having an input coupled to a programmable current source and an output coupled to an input of said amplifier portion, said sample and hold portion including a switching device for sampling an input voltage and a capacitive device for holding the input voltage.

28. A voltage source as defined in claim 27 wherein said amplifier portion further comprises an amplifier having first feedback path coupled from a first output to a first input of said amplifier.

29. A voltage source as defined in claim 28 further comprising a digital to analog converter having an output coupled to said sample and hold portion for providing said input voltage to said sample and hold portion.

30. A voltage source as defined in claim 29, wherein said digital to analog converter further comprises:
   an adjustable current source;
   an active load transistor; and
   a reference resistor having a first terminal coupled to said adjustable current source and a second terminal coupled to said active load transistor, said reference resistor adapted to provide said input voltage between said first and second terminals in response to an output current produced by said adjustable current source.

31. A sampled voltage source comprising:
   a reference resistor adapted to receive a programmed current to produce a programmed voltage;
   a sampling circuit including a storage location and a crowbar switch, an input of said sampling circuit coupled across said reference resistor to sample said programmed voltage; and
   an amplifier having an input coupled across an output of said sampling circuit, said amplifier including a feedback circuit coupled between said output of said amplifier and said input of said amplifier.

32. A sampled voltage source as defined in 31 wherein said storage location comprises a capacitors with a switch.

33. A sampled voltage source as defined in 32 wherein said amplifier having output impedance substantially lower than an impedance of said reference resistor.

* * * * *